United States Patent
Iseda

(10) Patent No.: US 7,799,237 B2
(45) Date of Patent: Sep. 21, 2010

(54) METHOD AND APPARATUS FOR ETCHING A STRUCTURE IN A PLASMA CHAMBER

(75) Inventor: Seiji Iseda, Katonah, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1120 days.

(21) Appl. No.: 11/440,918

(22) Filed: May 25, 2006

(65) Prior Publication Data

US 2007/0272358 A1    Nov. 29, 2007

(51) Int. Cl.
*B44C 1/22*     (2006.01)
*C03C 15/00*    (2006.01)
*C03C 25/68*    (2006.01)
*C23F 1/00*     (2006.01)

(52) U.S. Cl. .................. 216/67; 257/48; 324/713; 156/345.28; 156/345.47

(58) Field of Classification Search ............ 216/67; 257/48; 324/713; 156/345.28, 345.47
See application file for complete search history.

(56) References Cited

U.S. PATENT DOCUMENTS

| | | | |
|---|---|---|---|
| 4,496,448 A | 1/1985 | Tai et al. ................ 204/192 E |
| 5,082,517 A | 1/1992 | Moslehi ................... 156/345 |
| 5,170,098 A | 12/1992 | Dutton et al. .......... 315/111.21 |
| 5,407,524 A | 4/1995 | Patrick et al. .............. 156/627 |
| 5,556,549 A | 9/1996 | Patrick et al. ................ 216/61 |
| 5,571,366 A | 11/1996 | Ishii et al. .................. 156/345 |
| 5,707,486 A | 1/1998 | Collins .................... 156/643.1 |
| 6,095,084 A | 8/2000 | Shamouilian et al. ..... 118/723 E |
| 6,207,007 B1 | 3/2001 | Segawa et al. .............. 156/345 |
| 6,251,792 B1 | 6/2001 | Collins et al. ............... 438/710 |
| 6,281,469 B1 | 8/2001 | Perrin et al. ........... 219/121.43 |
| 6,392,187 B1 | 5/2002 | Johnson ................ 219/121.43 |
| 6,656,848 B1 | 12/2003 | Scanlan et al. ............. 438/710 |
| 6,706,138 B2 | 3/2004 | Barnes et al. ............ 156/345.1 |
| 6,872,322 B1 | 3/2005 | Chow et al. ................... 216/67 |
| 6,927,173 B2 | 8/2005 | Mori et al. ................. 438/710 |
| 6,998,027 B2 | 2/2006 | Chiu .......................... 204/146 |
| 2004/0135590 A1* | 7/2004 | Quon ........................ 324/713 |

OTHER PUBLICATIONS

S. Wolf and R.N. Tauber, (Silicon Processing for the VLSI Era, vol. 1-Process Technology, Lattice Press, 1986) pp. 570-571.*

* cited by examiner

*Primary Examiner*—Nadine G Norton
*Assistant Examiner*—Mahmoud Dahimene
(74) *Attorney, Agent, or Firm*—Stuart H. Mayer, Esq.; Karin L. Williams, Esq.; Mayer & Williams PC

(57) ABSTRACT

A plasma processing apparatus includes a plasma reaction chamber in which a plasma is generated for processing. First and second electrodes are located in the chamber for generating the plasma. First and second RF power sources provide RF power to the first and second electrodes, respectively. The apparatus also includes first and second impedance matching circuits through which the RF power is respectively provided from the first and second RF power supplies to the first and second electrodes. A first plasma controller monitors plasma density and, in response thereto, adjusts the RF power supplied by the first RF power source to the first electrode to achieve a given plasma density. A second plasma controller monitors the ion energy of plasma species impinging on a semiconductor structure associated with the second electrode and, in response thereto, adjusts the RF power supplied by the second RF power source to the second electrode to achieve a given ion energy.

7 Claims, 2 Drawing Sheets

METHOD AND APPARATUS FOR ETCHING A STRUCTURE IN A PLASMA CHAMBER

FIELD OF THE INVENTION

The present invention relates to plasma processing systems and, more particularly, to a method and apparatus for power control and delivery of radio frequency (RF) power in plasma process systems.

BACKGROUND OF THE INVENTION

Many thin film processes use plasma processes to facilitate the rapid and accurate fabrication of minute structures with desired properties. For instance, in the manufacture of integrated circuits, materials such as silicon dioxide, silicon nitride, polysilicon, metal, metal silicide, and monocrystalline silicon are etched in predefined patterns to form gates, vias, contact holes, trenches, and/or interconnect lines. In the etching process, a patterned mask composed of silicon oxide or silicon nitride (hard mask) or photoresist polymer, is formed on the substrate by conventional photolithographic methods. The exposed portions of the underlying material that lie between the features of the patterned mask are etched by capacitive or inductively coupled plasmas of etchant gas.

The plasma process usually involves placing the substrate in a vacuum chamber, introducing process gases and applying radio-frequency (RF) power, typically 0.1 to 200 MHz, to create the plasma. The plasma consists of ions, electrons, radical gas species and neutral gas, all of which permit the desired reaction to proceed. The plasma reaction has many inputs, including RF power, gas type and flow rates, chamber pressure, substrate and wall temperatures, chamber wall conditions, electrode spacing, and so on. The chamber configuration and chemistry used is chosen according to the desired process. For example, plasmas are used to etch dielectrics in semiconductor manufacture using specific plasma chamber designs such as Reactive Ion Etching (RIE) or Inductively Coupled Plasma (ICP) and using etching gases such as $CHF_3$, $CF_4$, $O_2$ and so on.

Capacitance coupled plasma chambers or reactors are usually constructed with a pair of parallel plate electrodes facing each other, spaced apart in parallel, and placed inside a vacuum chamber. As the term "capacitance coupled plasma" implies, the electrodes form a capacitor, typically of the parallel plate type. The most fundamental type is simply two flat plates of opposite electrical polarity and is often referred to as a "planar diode." The electrodes may be arranged in a variety of geometric configurations, including configurations having curved surfaces, such as concentric parallel cylinders or concentric spheres with parallel tangents. An external electric field, either DC or AC, is applied to the opposite electrodes. Under low pressure and with proper spacing between the electrodes, a stable plasma can be generated and maintained by first ionizing and then creating a glow discharge in gas flowing between the electrodes. Multiple pairs of alternating polarity parallel plates can be spaced apart and/or stacked together to form multiple regions where plasma discharge may occur. Such capacitance coupled plasma reactors have been widely used in a variety of industries for applications such as substrate etching, substrate cleaning, substrate film deposition, gas treatment, ion beam source and for various chemical reactions.

During the etching processes, etchant residue (e.g., polymer material) often deposits on the walls and other component surfaces inside the etching chamber. The composition of the etchant residue depends upon the chemical composition of the vaporized species of etchant gas, the material being etched, and the mask layer on the substrate. For example, when tungsten silicide, polysilicon or other silicon-containing layers are etched, silicon-containing gaseous species are vaporized or sputtered from the substrate; similarly, etching of metal layers results in vaporization of metal species. In addition, the mask layer on the substrate is also partially vaporized by the etchant gas to form gaseous hydrocarbon or oxygen species. The vaporized and gaseous species condense to form etchant residue comprising polymeric byproducts composed of hydrocarbon species from the resist; gaseous elements such as fluorine, chlorine, oxygen, or nitrogen; and elemental silicon or metal species depending on the composition of the substrate being etched. The polymeric byproducts deposit as thin layers of etchant residue on the walls and components in the chamber. The composition of the etchant residue typically varies considerably across the chamber surface depending upon the composition of the localized gaseous environment, the location of gas inlet and exhaust ports, and the geometry of the chamber.

Two important parameters in plasma-assisted processes are the plasma density and the ion energy of the species that impact on the wafer surface. Control of these parameters is important for controlling the quality of the structures being formed. However, it is difficult to control these parameters because they are generally not directly measured in conventional plasma chambers. Rather, the power that is supplied to the plasma is usually the parameter that is controlled. The supplied power, however, cannot be used as an indicator of the plasma density and ion energy because the impedance of the load to which the power is delivered is not constant with time. The impedance of the load changes because, as previously mentioned, during the manufacturing process, by-products of the reaction process (e.g., polymers) are deposited on the walls of the chamber. The by-products change the impedance, particularly the resistance, of the load. Of course, the effective power that is delivered to the plasma changes as the impedance of the load changes. Since the effective power changes, the plasma density and ion energy also change.

SUMMARY OF THE INVENTION

In accordance with the present invention, a plasma processing apparatus includes a plasma reaction chamber in which a plasma is generated for processing. First and second electrodes are located in the chamber for generating the plasma. First and second RF power sources provide RF power to the first and second electrodes, respectively. The apparatus also includes first and second impedance matching circuits through which the RF power is respectively provided from the first and second RF power supplies to the first and second electrodes. A first plasma controller monitors plasma density and, in response thereto, adjusts the RF power supplied by the first RF power source to the first electrode to achieve a given plasma density. A second plasma controller monitors the ion energy of plasma species impinging on a semiconductor structure associated with the second electrode and, in response thereto, adjusts the RF power supplied by the second RF power source to the second electrode to achieve a given ion energy.

In accordance with one aspect of the present invention, the plasma is produced by capacitively coupling the RF power into the chamber.

In accordance with another aspect of the invention, the semiconductor structure is mounted on the second electrode.

In accordance with another aspect of the invention, the first plasma controller measures a resistive load experienced by the first RF power source.

In accordance with another aspect of the invention, the given plasma density that is achieved is a constant plasma density during an etching process.

In accordance with another aspect of the invention, the given ion energy that is achieved is a constant ion energy during an etching process.

In accordance with another aspect of the invention, a method is provided for performing plasma etching on a structure. The method begins by establishing a plasma in a gaseous atmosphere that contacts a first electrode. Plasma density is monitored and an amount of RF power supplied to the first electrode is adjusted to achieve a given plasma density. The ion energy of plasma species impinging on a semiconductor structure associated with a second electrode is monitored and, in response thereto, an amount of RF power supplied to the second electrode is adjusted to achieve a given ion energy.

DETAILED DESCRIPTION

Figure 1:
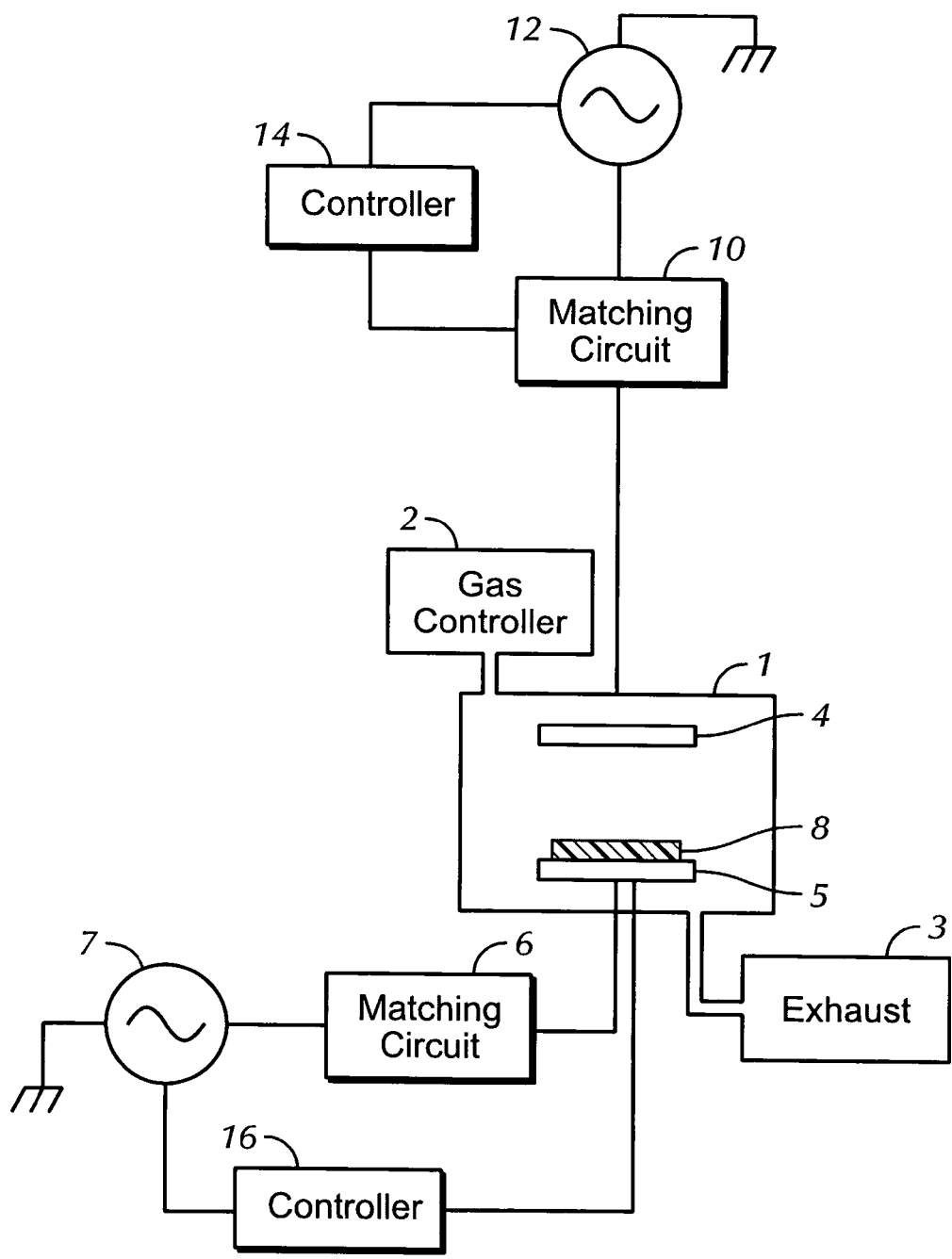
FIG. 1 is a schematic diagram showing a plasma etching apparatus constructed in accordance with the present invention.

FIG. 1 is a schematic diagram showing a plasma etching apparatus. As can be seen from the drawing, a reactive gas flow is introduced into a metallic chamber 1 through a gas controller 2, the gas flow being controlled to a proper pressure by an exhaust system 3. A first electrode 4 (e.g., an anode) is disposed in an upper portion of the chamber 1, and a sample stand 5 which serves as a second electrode (e.g., a cathode) is disposed in a lower portion of the chamber 1. The first electrode is connected to an RF power source 12 through a matching circuit 10 for generating and maintaining a plasma in the chamber 1. An RF power source 7 is connected to the sample stand 5 through an impedance matching circuit 6 so that the reactive ions in the plasma are accelerated in an ion sheath produced by the high frequency discharge to impinge upon the sample 8 (i.e., the material to be etched) so that an etching reaction occurs, which enables a highly directional etching operation, or a so-called anisotropic etching operation, to be carried out.

Although the invention is described with respect to a particular chamber configuration, it is understood that the invention is applicable to a variety of configurations and designs. Further, it is understood that the system is a simplified schematic representation and some aspects that may be part of the processing system are not shown. For example, actuators, valves, sealing assemblies and the like are not shown. Persons skilled in the art will readily recognize that these and other aspects may be incorporated into the processing system.

As previously noted, in plasma-assisted processing, an important process parameter is the plasma density. Plasma density is essentially defined as the number of free electrons per unit volume of plasma medium. Plasma density directly affects the concentration of activated charged and neutral species available for chemical reactions on the wafer surface and therefore affects the semiconductor wafer processing throughput or rate in a plasma equipment. In general, a greater plasma density produces a greater process throughput due to a larger etch, deposition, or cleaning rate. Plasma density, however, can also affect the final reliability and performance of semiconductor integrated circuits fabricated based on the plasma processing techniques. For example, if the process plasma density exceeds certain critical levels, the plasma medium may generate excessive concentrations of energetic species such as energetic ions and ultraviolet photons that could cause irradiation damage to the wafer surface and semiconductor devices. Therefore, it is desirable to precisely control the plasma density in a semiconductor wafer plasma processing reactor. In the processing system shown in FIG. 1, the plasma density is controlled by the RF power source 12 and the matching circuit 10 (discussed below).

Another important process parameter in plasma-assisted processing is the ion energy of the species that impact on the wafer surface. If the ion energy is too low, the material to be etched may not be effectively removed. If the ion energy is too great, the selectivity between the material to be etched and the underlying layer may be greatly reduced. As a result, pinholes or other undesirable features may be etched in the underlying layer. In the processing system shown in FIG. 1, the ion energy is controlled by the RF power source 7 and the matching circuit 6 (discussed below).

Impedance matching circuits 6 and 10 transform the real impedance of power sources 7 and 12, respectively, to match that of the complex plasma load. In particular, the matching network transforms the impedance (capacitive reactance) of the plasma discharge into a substantially resistive load for the radio frequency power source. The matching network between the radio frequency power source and the plasma chamber electrodes typically consists of variable capacitors and/or inductors as the variable matching components at low or high frequencies, and variable cavity taps or matching stubs at microwave frequencies. The matching network may be adjusted manually or automatically. Typically, the network adjusts automatically to changing etching process load conditions.

Of course, the matching circuits do not perfectly control the impedance so that all the power generated by the power sources is actually delivered to the plasma. The effective power, which is defined as the power actually delivered to the plasma, is equal to the difference between the power forwarded to the plasma by the matching circuit and the power reflected by the matching circuit In conventional processes, the effective power is controlled by monitoring the reflected power from the matching circuits. Unfortunately, as previously mentioned, during the manufacturing process, by-products of the reaction process are deposited on the walls of the chamber, which changes the impedance of the plasma load. As a result, the effective power that is delivered to the plasma changes as the impedance changes. Because of the changes in the effective power, the plasma density and ion energy also change over time because of the deposition of by-products.

The adverse effects of fluctuations in the plasma density and ion energy are illustrated in connection with FIGS. 2-4, in which like elements are denoted by like reference numerals. As shown, in this example a semiconductor structure 200 includes a polysicilion layer 210 formed on a gate oxide layer 212 that is in turn formed on a silicon substrate 214. The polysilicon layer 210 is being etched through a mask 216 to define a gate electrode.

Figure 2:
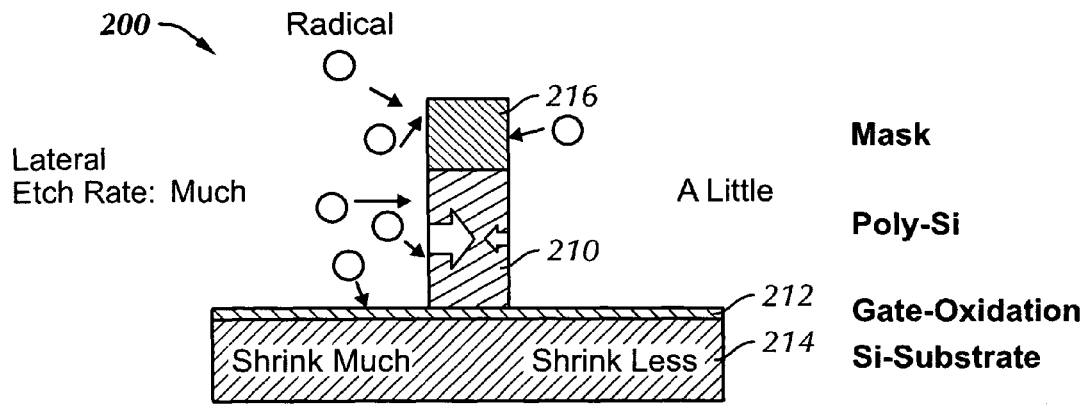
FIG. 2 shows the affects of plasma density on an etching process performed on a semiconductor structure.

To illustrate the processes involved, in FIG. 2 the side of the structure 200 to the left of the mask 216 is illustrated as being exposed to a high plasma density and the right side of the structure is illustrated as being exposed to a low plasma density. In the case of a high plasma density, the lateral etch rate increases and instead of anisotropically etching the polysilicon layer 210, the polysilicon layer 210 is more nearly isotropically etched. The isotropic etching reduces the lateral dimension of the gate electrode that is formed from the polysilicon layer 210.

Figure 3:
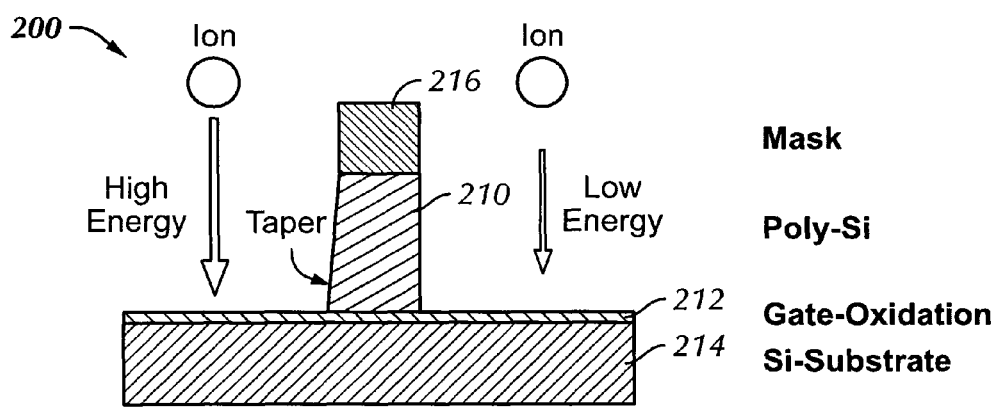
FIGS. 3-4 shows the affects of ion energy on an etching process performed on a semiconductor structure.
Figure 4:
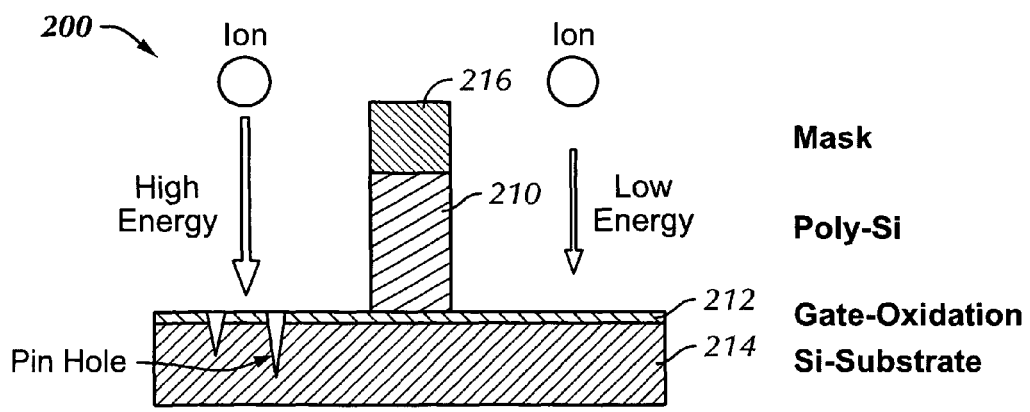

In FIGS. 3 and 4, the side of the structure 200 to the left of the mask 216 is illustrated as being etched with a high ion energy and the right side of the structure is illustrated as being etched with a low ion energy. In the case of high ion energy, FIG. 3 shows that the sidewalls of the polysilicon layer 210 are not etched vertically, but rather are tapered. In FIG. 4, pin-holes are formed in the gate oxide layer and the substrate as result of the high ion energy.

To overcome these problems caused by fluctuations in plasma density and ion energy, the present invention monitors additional parameters that are used to control the power supplied by the RF power sources 7 and 12 so that the plasma density and ion energy can be better controlled.

As indicated above, matching circuits 6 and 10 control the capacitive and inductive components of the plasma impedance load, but not the resistive component. Since the deposition by-products that accumulate on the chamber walls over time change the resistive component of the impedance, the matching circuit 10 cannot maintain a constant plasma density. To overcome this problem, the present invention employs a plasma controller 14 that monitors the plasma density by measuring the resistive component of the plasma's impedance load. As shown, the plasma controller 14 is interconnected in parallel with the RF source 12 and the matching circuit 10. As the resistive component of the load changes over time, the plasma controller 14 adjusts the RF power supplied by the RF source 12 so that the plasma density remains constant even as material accumulates on the chamber walls. That is, by measuring the resistive load the plasma controller 14 generates a signal representative of the plasma density. The signal is applied to the RF generator and, in response thereto, the power that is supplied by the RF generator is adjusted so that the plasma density is maintained at a constant value that may or may not be predetermined. Of course, instead of maintaining a constant plasma density, the plasma controller 14 may also be used to vary the plasma density in a controlled manner over time.

The present invention also employs a second plasma controller 16 to monitor and control the ion energy of the species impinging on the wafer. As shown, the second plasma controller 16 is interconnected between the electrode 5 and RF source 7. The second plasma controller 16. In this way the second plasma controller 16 generates a signal representative of the ion energy. The second signal is applied to the RF generator and, in response thereto, the power that is supplied by the RF generator is adjusted so that the ion energy is maintained at a desired value.

The above-described plasma etching arrangement provides a number of advantages over conventional arrangements. For instance, by maintaining a constant plasma density and ion energy, the lateral and vertical etch rates can be better controlled. Also, a given etch rate results in a uniform etch profile and a constant critical dimension (e.g., linewidth). By controlling the ion energy the selectivity between the layer being etched (e.g., polysilicon) and the underlying layer (e.g., gate oxide) can also be controlled, thereby avoiding pitting in the underlying layer. Furthermore, productivity and throughput is increased by controlling the plasma density and the ion energy.

The invention claimed is:

1. A method for performing plasma etching on a structure, comprising:
    establishing a plasma in a gaseous atmosphere that contacts a first electrode;
    monitoring plasma density by measuring the resistive component of the plasma's impedance load, and adjusting an amount of RF power, from a first RF power supply, supplied to the first electrode to achieve a given plasma density; and
    monitoring ion energy of plasma species impinging on a semiconductor structure associated with a second electrode and, in response thereto, adjusting an amount of RF power, from a second RF power supply, supplied to the second electrode to achieve a given ion energy.

2. The method of claim 1 wherein said plasma is produced by capacitively coupling the RF power into a chamber.

3. The method of claim 1 wherein the semiconductor structure is mounted on a second electrode.

4. The method of claim 1 wherein the step of monitoring the plasma density includes measuring a resistive load experienced by a first RF power source that establishes the plasma.

5. The method of claim 1 wherein the given plasma density that is achieved is a constant plasma density during an etching process.

6. The method of claim 1 wherein the given in energy that is achieved is a constant ion energy during an etching process.

7. The method of claim 5 wherein the given ion energy that is achieved is a constant ion energy during an etching process.

* * * * *